(12) United States Patent
Mulligan

(10) Patent No.: US 6,949,968 B1
(45) Date of Patent: Sep. 27, 2005

(54) METHOD FOR INCREASING THE SENSITIVITY OF INTEGRATED CIRCUIT TEMPERATURE SENSORS

(75) Inventor: Michael David Mulligan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/784,140

(22) Filed: Feb. 20, 2004

(51) Int. Cl.$^7$ .............................................. H01L 35/00
(52) U.S. Cl. ..................................................... 327/512
(58) Field of Search ............................... 327/512, 513; 340/155

(56) References Cited

U.S. PATENT DOCUMENTS

| | | | | |
|---|---|---|---|---|
| 3,790,910 A | * | 2/1974 | McCormack | 702/138 |
| 5,140,302 A | * | 8/1992 | Hara et al. | 340/449 |
| 5,436,614 A | * | 7/1995 | Torikoshi et al. | 340/584 |
| 6,392,582 B1 | * | 5/2002 | Nakamura | 341/155 |
| 6,614,373 B1 | * | 9/2003 | Frazier | 341/143 |

OTHER PUBLICATIONS

"LM34/LM35 Precision Monolithic Temperature Sensors," Application Note 460-Oct. 1986, *National Semiconductor Corporation*, (13 pages).
"Temperature Sensor Handbook," *National Semiconductor Corporation* Dec. 1994-Oct. 1997, (40 pages).
"High-Slope, Low-Power, Analog Temperature Sensor in an SC70 Package," *Maxim Integrated products, 2002* (5 pages).

* cited by examiner

*Primary Examiner*—Jeffrey Zweizig
(74) *Attorney, Agent, or Firm*—Brett A. Hertzberg; Merchant & Gould PC

(57) ABSTRACT

A method and apparatus are arranged to provide increased sensitivity for a temperature sensor in an integrated circuit such that the accurate temperature sensing is achieved over a broad temperature range. A temperature sense signal from a VPTAT circuit is coupled to a level shifter to provide a level shifted signal. The level shifted signal is coupled to a gain block to provide an output signal with increased signal amplitude. The output signal is fed to an analog-to-digital converter (ADC) that is in communication with control logic. The control logic dynamically adjusts at least one parameter associated with the level shifter circuit and/or the gain block to maximize the dynamic range associated with the temperature sense signal.

20 Claims, 9 Drawing Sheets

US 6,949,968 B1

METHOD FOR INCREASING THE SENSITIVITY OF INTEGRATED CIRCUIT TEMPERATURE SENSORS

FIELD OF THE INVENTION

The present invention is related to the field of temperature sensors. In particular, the present invention is related to a method and apparatus for increasing the sensitivity of a temperature sensor in an integrated circuit over a broad temperature range.

BACKGROUND OF THE INVENTION

FIG. 1A illustrates an example schematic (100) for an analog temperature sensor system. The analog temperature sensor system includes two resistors (R1, R2), a zener regulator (ZREG), and an optional gain block (G).

Zener regulator ZREG is connected between a first terminal and a ground terminal, and provides a control signal (ADJ) output. Resistor R1 is connected between power supply terminal VDD and the first terminal. Resistor R2 is connected between the first terminal and a ground terminal, and has a variable resistance value that is adjusted by control signal ADJ. The gain block receives a sense voltage ($V_{SNS}$) from the first terminal and provides an output voltage ($V_{OUT}$) at a second terminal.

FIG. 1B illustrates the operational sense voltage ($V_{SNS}$) for the analog temperature sensor system that is illustrated by FIG. 1A. The sense voltage ($V_{SNS}$) has a nominal value that is defined at a predetermined operating temperature. The sense voltage ($V_{SNS}$) varies from the nominal value over a defined temperature range. As illustrated by FIG. 1B, the sense voltage ($V_{SNS}$) has a predetermined slope over operating temperatures T1 through T2 that corresponds to 10 mV/° K. In another example, the sense voltage may have a slope that corresponds to 10 mV/° C. The gain block (G) may be employed to provide an output voltage ($v_{OUT}$) that corresponds to a gain scaled version of the sense voltage ($V_{SNS}$). The voltages resulting from the operation of the analog temperature sensor system ($V_{SNS}$ and $V_{OUT}$) are proportional to absolute temperature (VPTAT).

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1A:
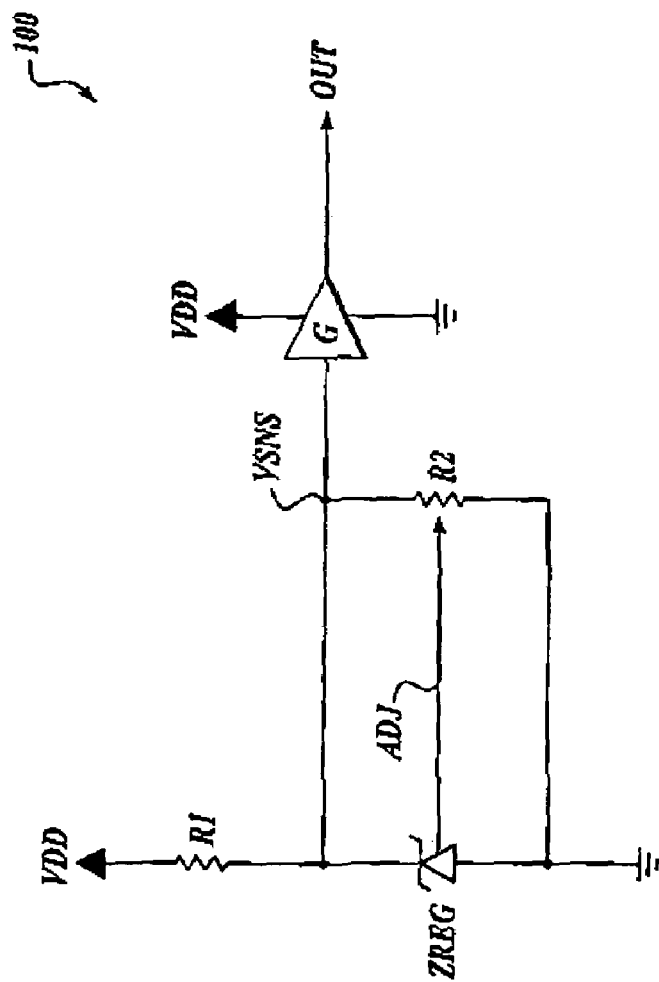
FIG. 1A illustrates an example schematic for a conventional analog temperature sensor system.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" includes a direct electrical connection between the items connected and an indirect connection through one or more passive and/or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a method and apparatus for increasing the sensitivity of a temperature sensor in an integrated circuit such that the accurate temperature sensing is achieved over a broad temperature range. The temperature sense signal from a VPTAT circuit is coupled to a level shifter to provide a level shifted signal. The level shifted signal is coupled to a gain block to provide an output signal with increased signal amplitude. The output signal is fed to an analog-to-digital converter (ADC) that is in communication with control logic. The control logic dynamically adjusts at least one parameter associated with the level shifter circuit and/or the gain block to maximize the dynamic range associated with the temperature sense signal.

Figure 2:
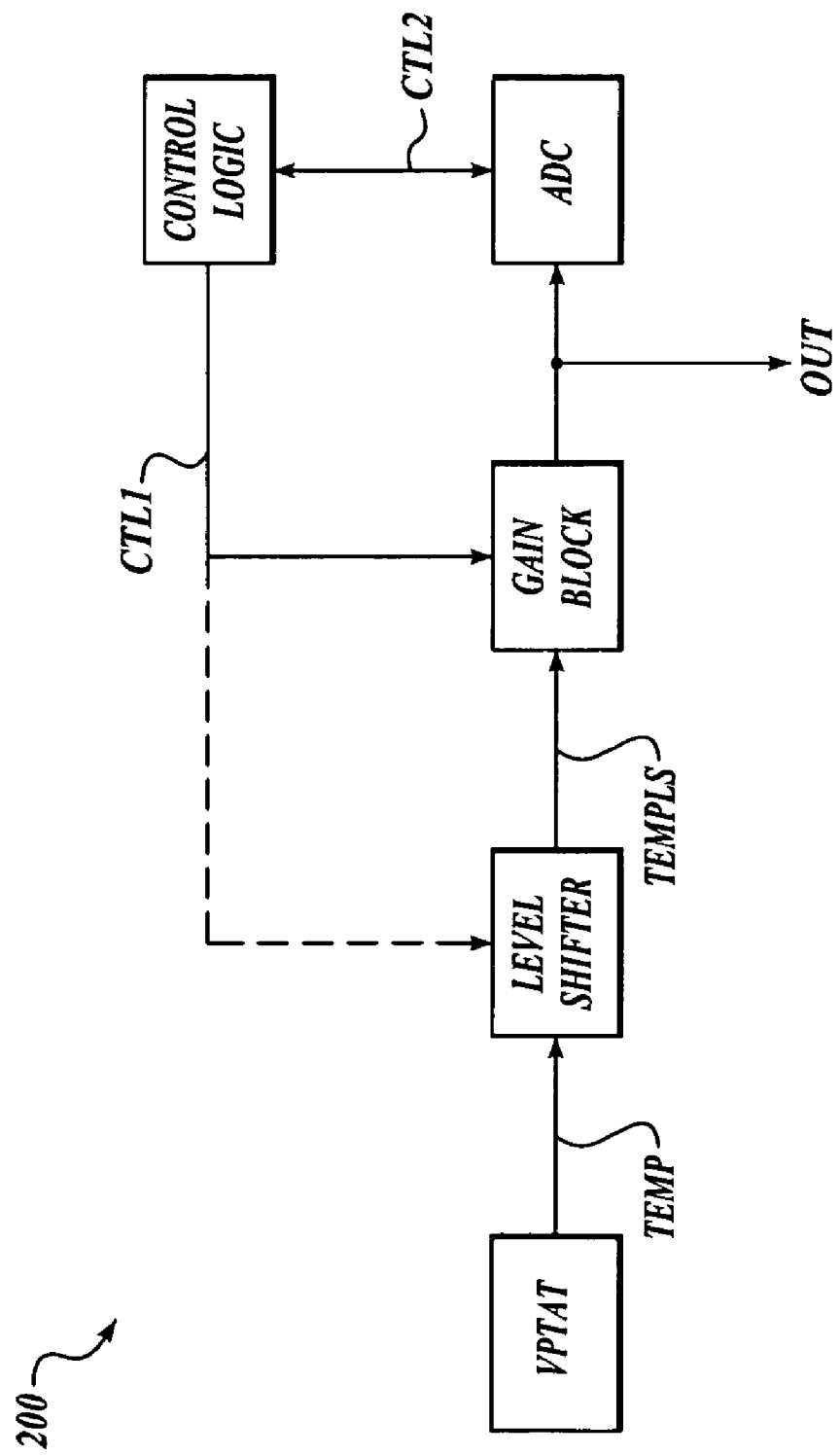
FIG. 2 illustrates a schematic diagram for a temperature sensor system.

FIG. 2 illustrates a schematic diagram for a temperature sensor system (200) that is arranged in accordance with an aspect of the invention. Temperature system 200 includes a VPTAT sensor block, a level shifter block, a gain block, an analog-to-digital converter (ADC) block, and a control logic block.

Figure 1B:
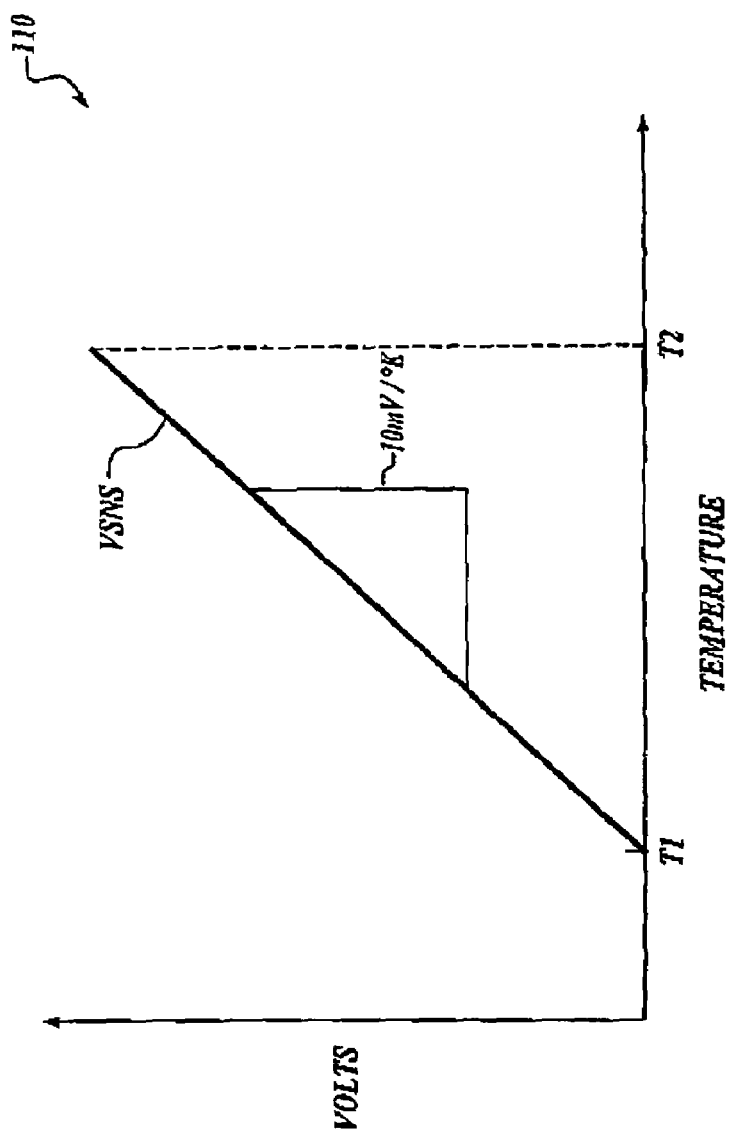
FIG. 1B illustrates the operational sense voltage ($V_{SNS}$) for the analog temperature sensor system that is illustrated by FIG. 1A.

The VPTAT sensor block is arranged to provide a signal (TEMP) that is responsive to changes in temperature (e.g., see FIGS. 1A and 1B). The level shifter block is arranged to receives signal TEMP and provide a DC level shifting function resulting in signal TEMPLS. The gain block is arranged to receive signal TEMPLS and provide a gain adjustment function resulting in signal OUT. The ADC block is arranged to convert signal OUT to a digital quantity as illustrated by signal CTL2. The control logic block is arranged to receive signal CTL2 and provide signal CTL1.

The control logic block is arranged to adjust signal CTL1 to provide a closed loop control system. In one example, signal CTL1 is provided as a control signal to the gain block. In another example, signal CTL1 is provided as a control signal to the level shifter block. In still another example, signal CTL1 is provided as one or more control signals to the level shifter block and the gain block. By dynamically adjusting at least one of the gain block and the level shifter block the overall dynamic range of the system is extended. The mechanisms for increasing dynamic range will be further illustrated by additional examples as described below.

Figure 3:
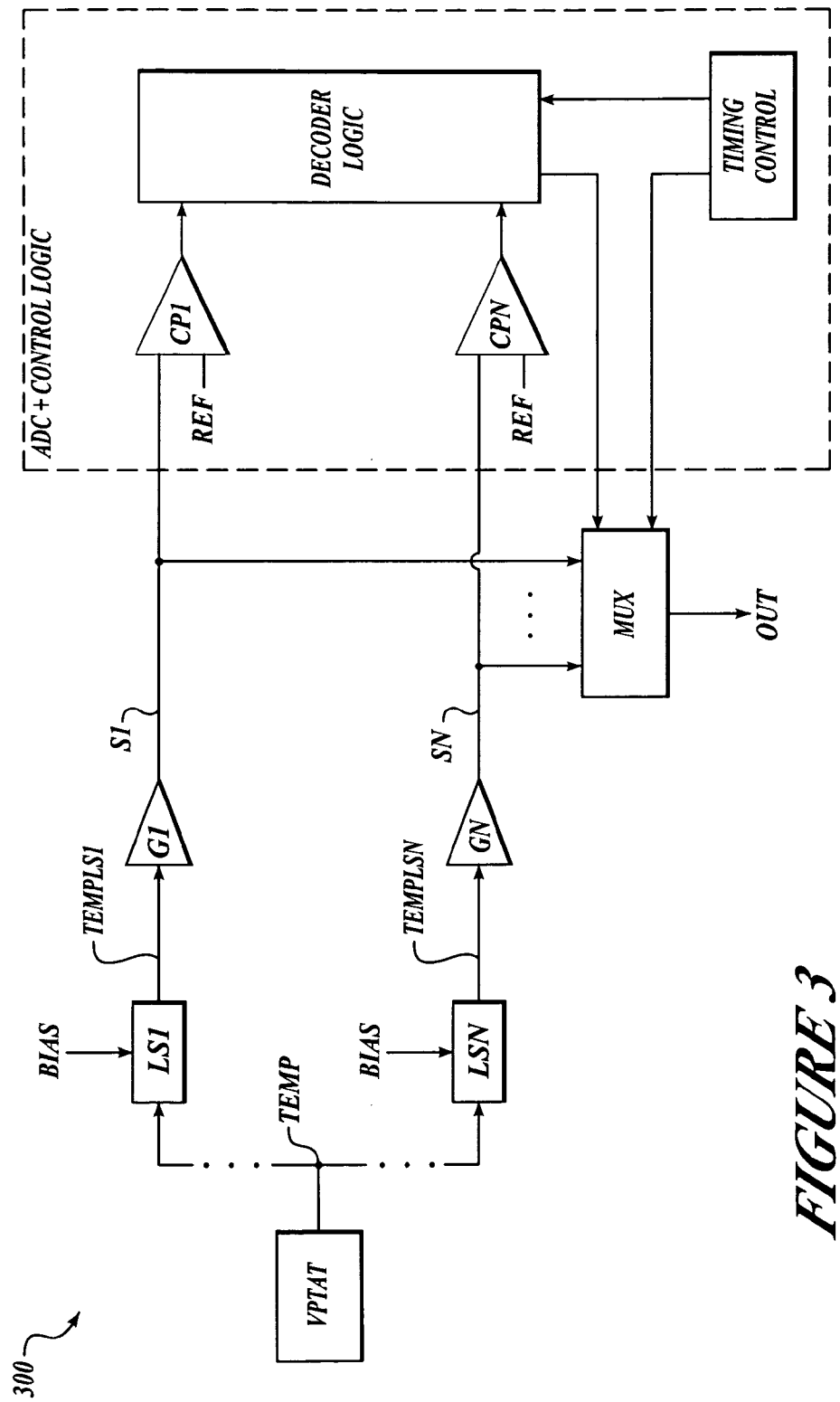
FIG. 3 illustrates a detailed example schematic diagram for a temperature sensor system.

FIG. 3 illustrates a detailed example schematic diagram for a temperature sensor system (300) that is arranged in accordance with another aspect of the present invention. Temperature sensor system 300 includes: a VPTAT circuit, level shifter circuits (LS1–LSN), gain circuits (G1–GN), a multiplexer (MUX) circuit, and an ADC circuit that includes associated control logic. In another example system, the VPTAT circuit is replaced with a current PTAT (IPTAT) circuit that operates similarly.

The VPTAT circuit is arranged to provide a signal (TEMP) that is responsive to changes in temperature (e.g., see FIGS. 1A and 1B). The level shifter circuits (LS1–LSN) are each arranged to receive signal TEMP and provide a DC level shifting function resulting in signal TEMPLS1–TEMPLSN. Each gain circuit (G1–GN) is arranged to receive a respective one of signals TEMPLS1–TEMPLSN, and provide a gain adjustment function resulting in signals S1–SN. The ADC block is arranged to receive signals S1–SN, and provides one or more control signals in response thereto. The MUX circuit is arranged to receive signals S1–SN, and provides an output signal (OUT) that corresponds to a selected one of the signals S1–SN in response to the control signal (or signals) from the ADC circuit.

An example ADC circuit includes comparator circuits (CP1–CPN), a decoder logic circuit, and a timing control circuit. Each comparator circuit (CP1–CPN) is responsive to a reference signal (REF) and a respective one of signals S1–SN. The outputs of the comparator circuits are provided to the decoder logic, which detects various threshold points associated with the temperature signal (TEMP). The MUX circuit will select one of signals S1–SN based on the detected threshold level associated with the temperature signal via the control signals that are provided from the decoder logic. The timing control circuit is an optional component that is arranged to provide discrete times for: evaluating the temperature signal via the decoder logic, and selecting the output signal (OUT) via the MUX circuit.

An example ideal temperature sensor output signal (e.g., TEMP=$V_{SNS}$) is illustrated in FIG. 1B. The sensitivity of the sensor output signal (e.g., TEMP) is measured by the change in voltage over the change in temperature as: $\phi_S = \Delta V/\Delta T$. The sensitivity of a temperature sensor that operates over the entire supply voltage range (e.g., VDD) corresponds to: $\phi_s = VDD/\Delta T$. The system described in FIG. 3 illustrates a mechanism for decoupling the sensitivity of the overall sensor from a dependency on either power supply voltage (VDD) or extends the operating temperature range ($\Delta T$). The sensitivity range is extended by selecting a preferred gain and/or offset setting to provide maximum performance within an identified temperature range.

Figure 4A:
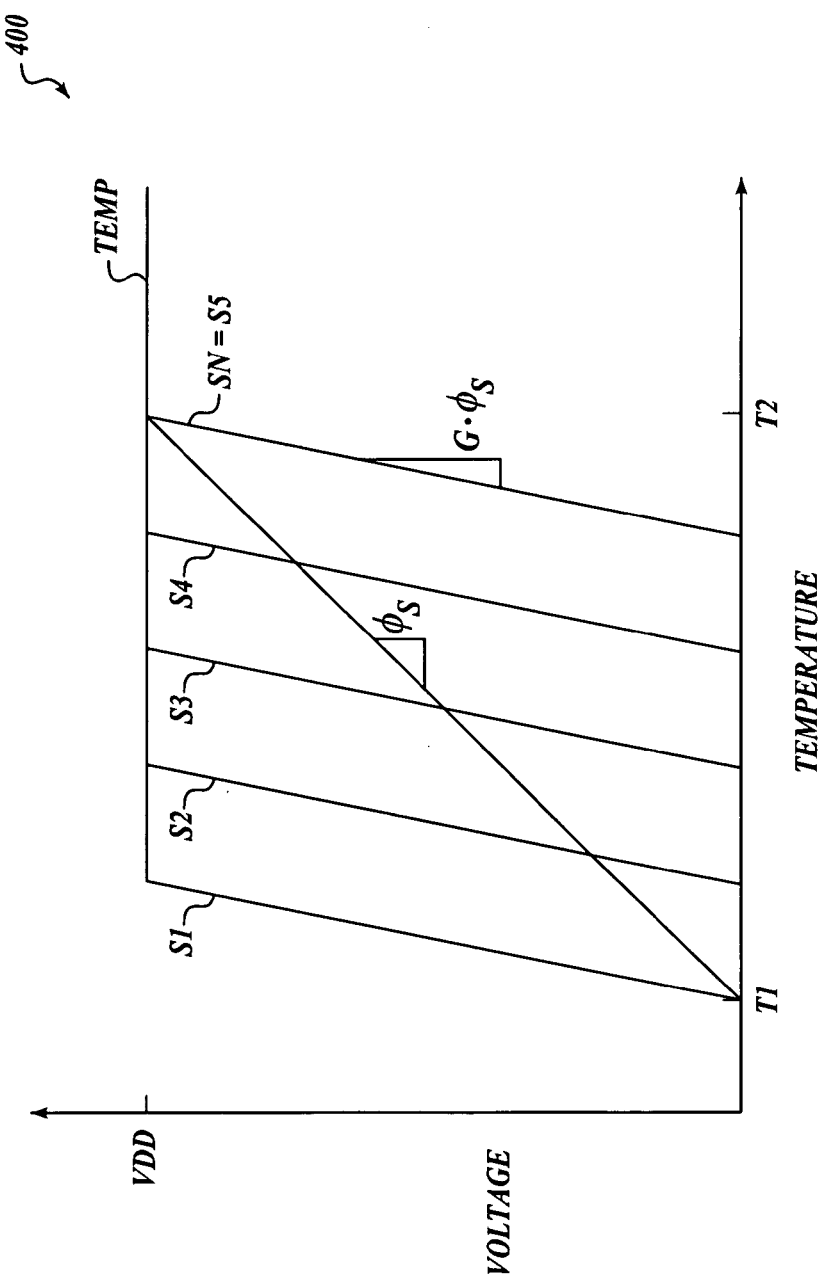
FIG. 4A illustrates a graph for example signals in a temperature sensor system.

FIG. 4A illustrates a graph (400) for example signals in a temperature sensor system that is arranged in accordance with an aspect of the present invention. For the example illustrated by FIG. 4A, the temperature system has five amplifier circuits (G1–G5), five corresponding level shifter circuits (LS1–LS5), and five comparator circuits (CP1–CP5). Each of the amplifiers circuits has a gain of G. The ideal temperature sensor signal (TEMP) is illustrated by the signal with the slope $\phi_S$ as previously described with respect to FIG. 1B. In a first temperature range signal S1 (the output of level shifter circuit LS1 and amplifier circuit G1) provides a gain of G to signal TEMP, resulting in a temperature signal with a slope of $G \cdot \phi_S$. Signals S2–S5 illustrate the same slopes in additional temperature intervals.

Figure 4B:
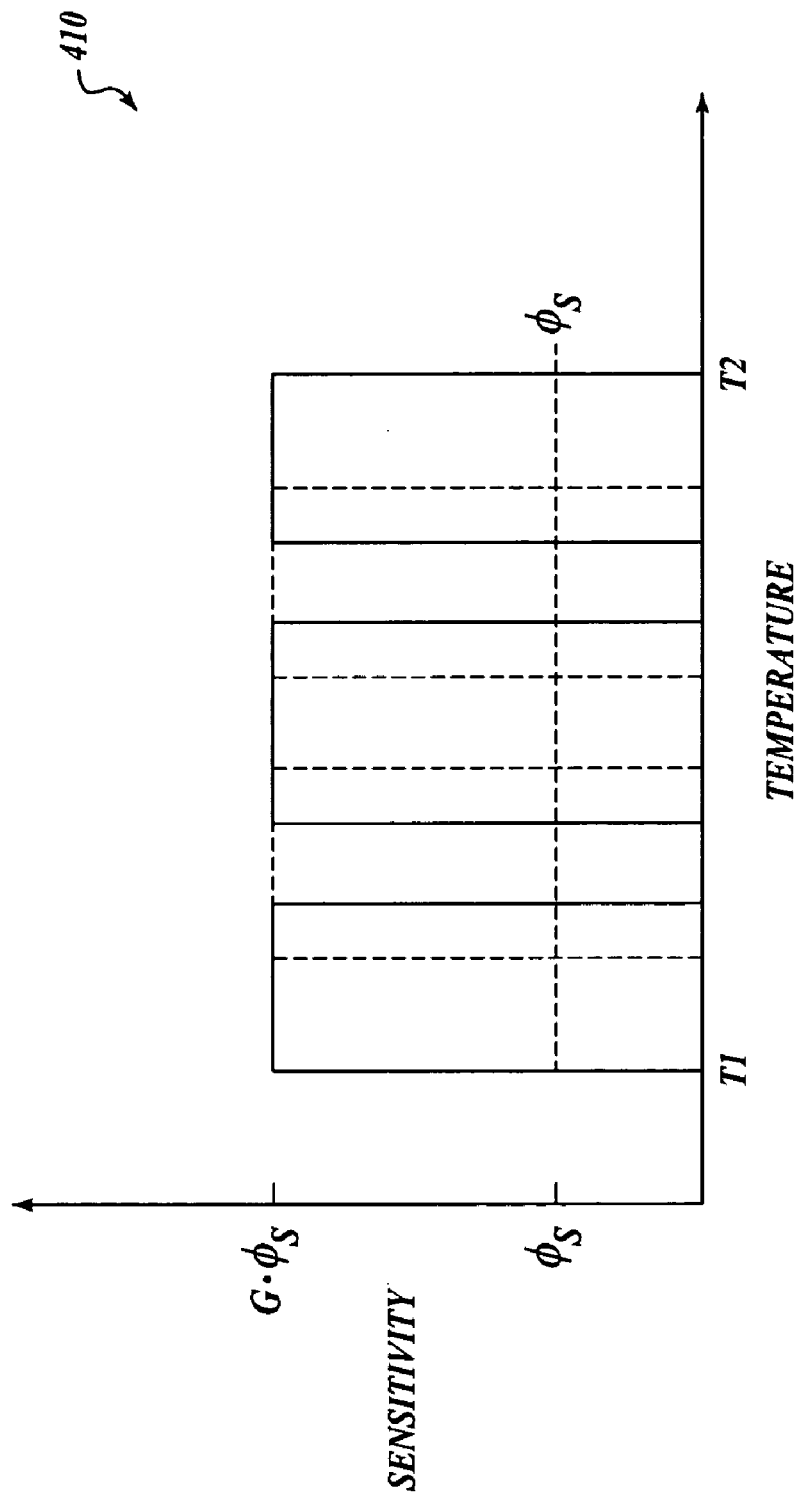
FIG. 4B illustrates a graph of example sensitivity ranges in a temperature sensor system.

FIG. 4B illustrates a graph (410) of example sensitivity ranges in the temperature sensor system of FIG. 4A. The effective sensitivities at the outputs of the amplifiers are combined through the MUX circuit (see FIG. 3). Although each amplifier circuit (G1–G5) has a narrower overall operating temperature range, the effective temperature range at the output of the MUX circuit extends over the entire range of temperatures (T1–T2).

The ADC circuit (including supporting logic) is arranged to evaluate each signal (S1–SN) from the amplifier circuits (G1–GN) to select an appropriate output (OUT) via the MUX circuit. Each amplifier circuit has an operating range (e.g., an input voltage range) for which the amplifier provides an output signal that is responsive to changes in the input signal. Each level shifter circuit is arranged in cooperation with an amplifier circuit such that the output signal is responsive to changes in the temperature signal (TEMP) over a predetermined temperature range. For example, amplifier circuit G1 and level shifter circuit LS1 may be optimized for a signal range that requires no offset such that level shifter circuit LS1 may be eliminated. In another example, level shifter circuit LS1 provides a positive offset to the temperature signal (TEMP). In still another example, level shifter circuit LS2 provides a negative offset to the temperature signal (TEMP).

Each level shifter circuit (LS1–LSN) is arranged to set the temperature sensitivity range for the correspondingly paired amplifier circuit (G1–GN). The offset positive or negative based on design of the amplifier and/or the designed operating range of the sensor. In one example sensor system four amplifiers, each with an output range from 0V to +2V and a gain of 500, is arranged to cooperate with a sensor that has a sensitivity range from −10 mV to +10 mV. For this example sensor system, the first amplifier is paired with a level shifter of +10 mV yielding a full range of sensitivity for temperature signals from −10 mV to −5 mV, the second amplifier is paired with a level shifter of +5 mV yielding a full range of sensitivity for temperature signals from −5 mV to 0V, the third amplifier is paired with a level shifter of +0 mV (or no level shifter) yielding a full range of sensitivity for temperature signals from 0 mV to 5 mV, and the fourth amplifier is paired with a level shifter of −5 mV yielding a full range of sensitivity for temperature signals from +5 mV to +10 mV.

In an example operating sequence, signal S1 from amplifier circuit G1 and level shifter circuit LS1 is selected when the temperature is in a range just above temperature T1. As the temperature further increases above temperature T1, signal S1 will approach the supply voltage (e.g., VDD) and amplifier circuit G1 will be unable to continue providing gain to the temperature signal (TEMP). Thus, as temperature signal TEMP continues to increase, the level shift circuit is required to decrease the signal level such that the next amplifier in the sequence (e.g., G2) is operable over the input voltage range of the amplifier for further increasing temperatures.

Figure 5:
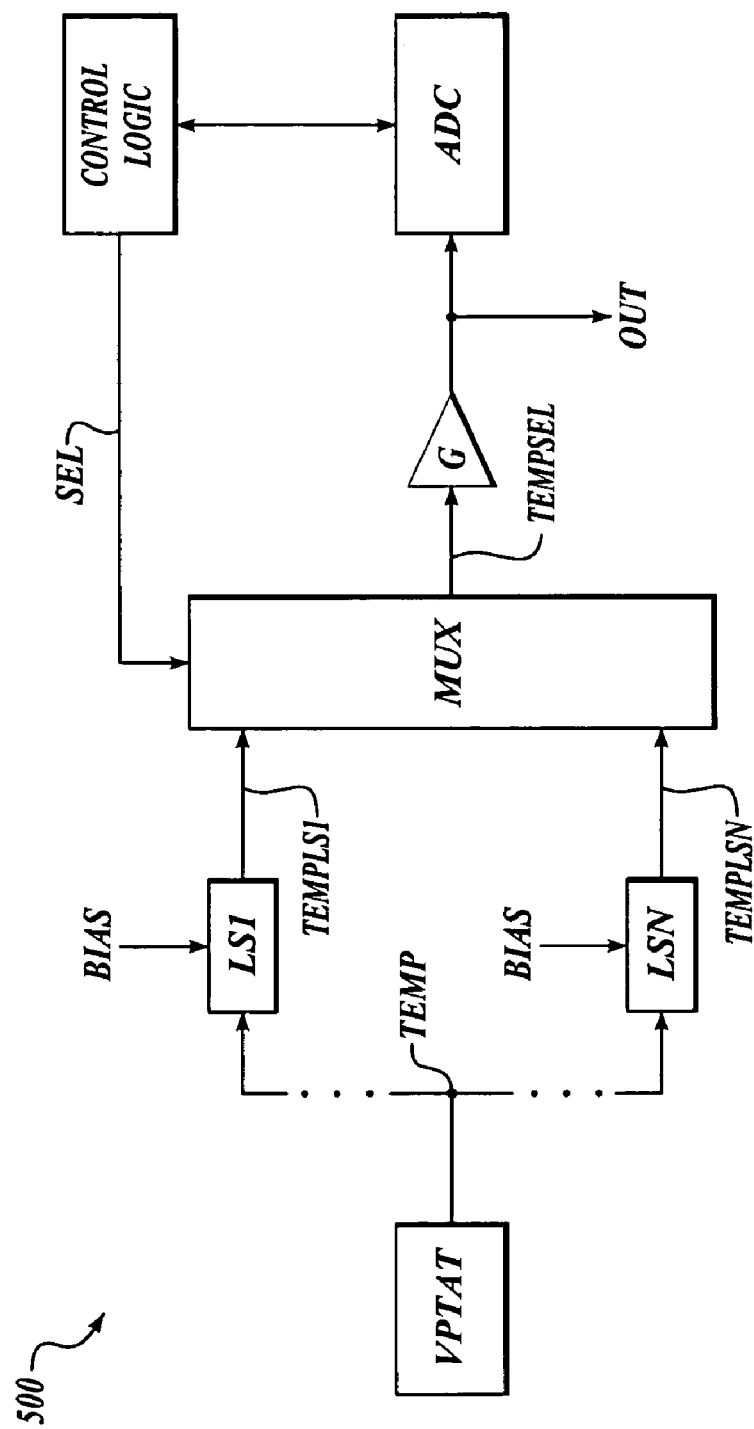
FIG. 5 illustrates another detailed example schematic diagram for a temperature sensor system.

FIG. 5 illustrates another detailed example schematic diagram for a temperature sensor system (500) that is arranged according to yet another aspect of the present invention. Temperature system 500 includes a VPTAT circuit, level shifter circuits (LS1–LSN), a gain circuit (G), a multiplexer (MUX) circuit, and an ADC circuit with associated control logic. In another example system, the VPTAT circuit is replaced with a current PTAT (IPTAT) circuit that operates similarly.

The VPTAT circuit is arranged to provide a signal (TEMP) that is responsive to changes in temperature (e.g., see FIGS. 1A and 1B). The level shifter circuits (LS1–LSN) are each arranged to receive signal TEMP and provide a DC level shifting function resulting in signal TEMPLS1–TEMPLSN. The MUX circuit is arranged to receive signals TEMPLS1–TEMPLSN, and provides an output signal (TEMPSEL) that corresponds to a selected one of the signals TEMPLS1–TEMPLSN in response to the control signal (SEL) or signals from the control logic of the ADC circuit. The gain circuit (G) is arranged to receive signal TEMPSEL and provide a gain adjustment function resulting in the output signal (OUT). The ADC block is arranged to receive the output signal (OUT), and provides one or more signals to the control logic.

The operation of temperature sensor system 500 is substantially similar in theory to that described previously with respect to FIGS. 3–4. However, the multiple amplifier circuits described in FIG. 3 are replaced with a single amplifier circuit that is multiplexed with the various level shifting circuits. By using a single amplifier circuit overall power consumption is reduced and offset mismatches between amplifier circuits are eliminated.

Figure 6:
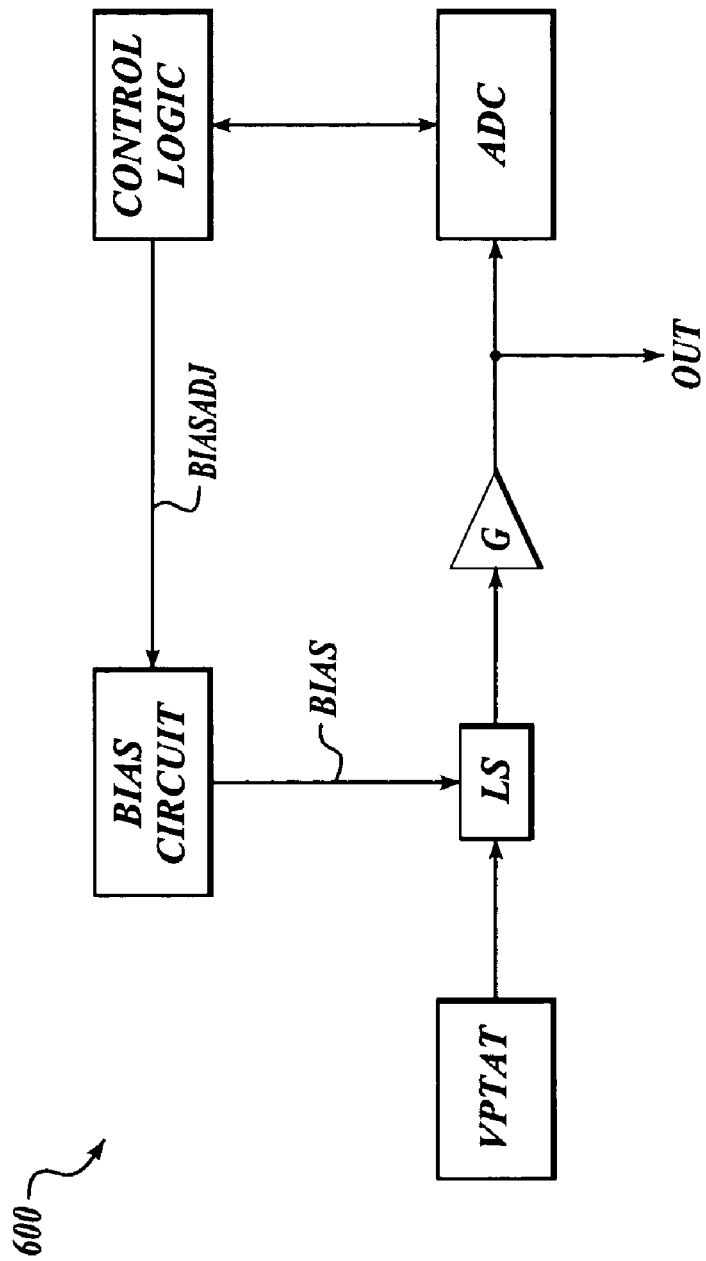
FIG. 6 illustrates still another detailed example schematic diagram for a temperature sensor system.

FIG. 6 illustrates still another detailed example schematic diagram for a temperature sensor system (600) that is arranged according to still another aspect of the present invention. Temperature sensor system 600 includes a VPTAT circuit, a level shifter circuit (LS), a gain circuit (G), an adjustable bias circuit, and an ADC circuit with associated control logic. In another example system, the VPTAT circuit is replaced with a current PTAT (IPTAT) circuit that operates similarly.

The VPTAT circuit is arranged to provide a signal (TEMP) that is responsive to changes in temperature (e.g., see FIGS. 1A and 1B). The level shifter circuit (LS) is each arranged to receive signal TEMP and provide a DC level shifting function resulting in signal TEMPLS. The gain circuit (G) is arranged to receive signal TEMPLS and provide a gain adjustment function resulting in the output signal (OUT). The ADC block is arranged to receive the output signal (OUT), and provides one or more signals to the control logic. The control logic is arranged to provide one or more signals (BIASADJ) to the adjustable bias circuit. The adjustable bias circuit is arranged to provide a bias signal (BIAS) to the level shifter circuit such that the DC level shift that is provided to signal TEMP is varied in response to signal BIASADJ.

The operation of temperature sensor system 500 is substantially similar in theory to that described previously with respect to FIGS. 3–5. However, the multiple amplifier circuits described in FIG. 3 are replaced with a single amplifier circuit, and the multiple level shifter circuits are replaced by a single level shifter circuit that is dynamically biased. By using a single amplifier circuit and a single level shifter circuit the overall power consumption of the system is reduced and offset mismatches between amplifier circuits and level shifter circuits are eliminated.

Figure 7:
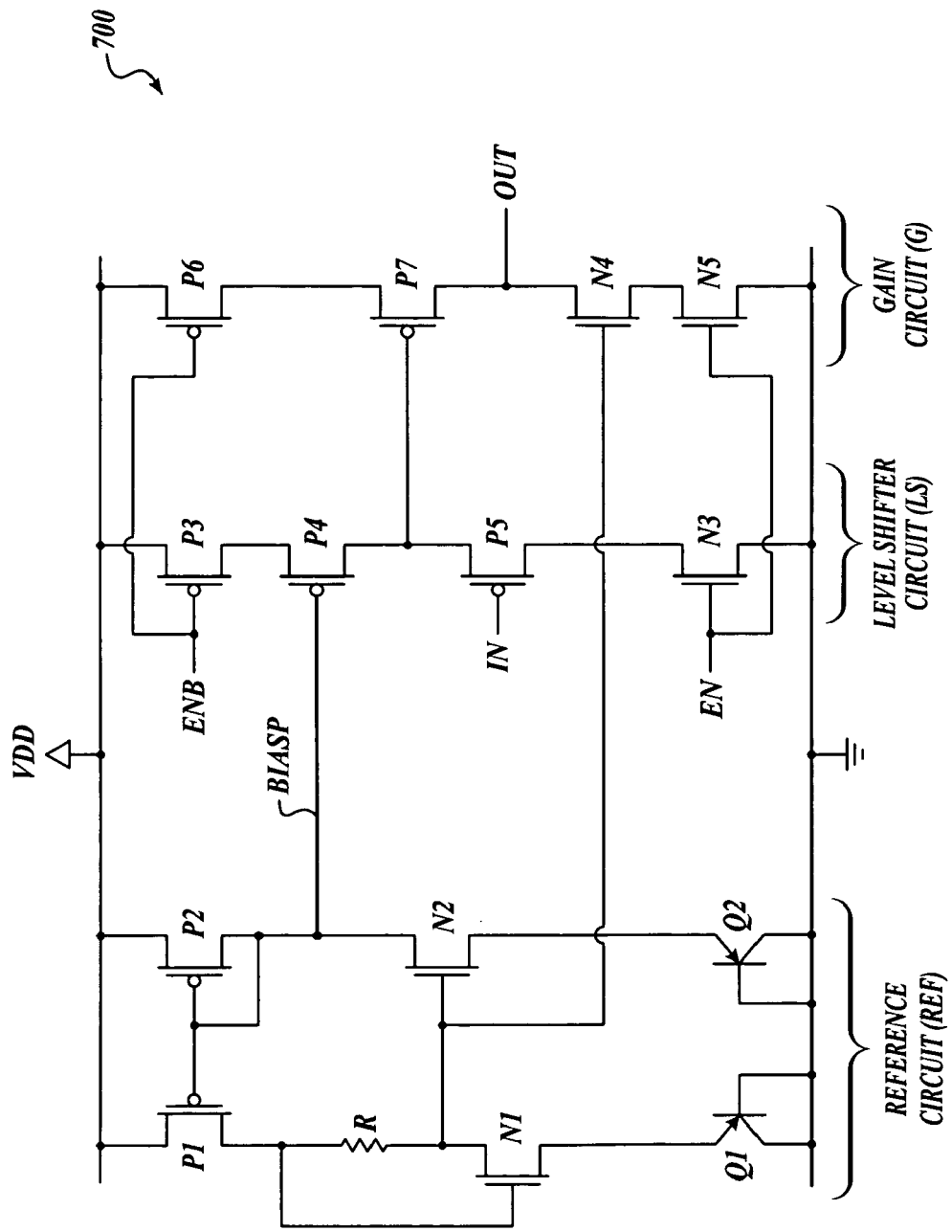
FIG. 7 illustrates an example schematic diagram for a reference circuit, a level shifter circuit, and a gain circuit, arranged in accordance with the present invention.

FIG. 7 illustrates an example schematic diagram (700) for a reference circuit (REF), a level shifter circuit (LS), and a gain circuit (G) that are arranged in accordance with the present invention. The reference circuit includes six transistors (P1–P2, N1–N2, and Q1–Q2) and a resistor (R). The level shifter circuit (LS) includes four transistors (P3–P5, and N3). The gain circuit (G) includes four transistors (P5–P6, and N4–N5).

Transistors P1 and P2 are arranged in a current mirror configuration, while transistors Q1 and Q2 are arranged in diode configurations. Resistor R is coupled between the drain of transistor P1 and the drain of transistor N1. Transistor N1 includes a source that is coupled to the emitter of transistor Q1, and a gate that is coupled to the drain of transistor P1. Transistor N2 includes a drain that is coupled to the drain of transistor P2, a gate that is coupled to the drain of transistor N1, and a source that is coupled to the emitter of transistor Q2. The gate of transistor P2 corresponds to signal BIASP, while the gate of transistor N2 corresponds to signal BIASN.

Transistor P3 includes a source that is coupled to VDD, a gate that receives signal ENB, and a drain that is coupled to the source of transistor P4. Transistor P4 includes a gate that is arranged to receive signal BIASP, and a drain that is coupled to the source of transistor P5. Transistor P5 has a gate that receives signal IN, and a drain that is coupled to the drain of transistor N3. Transistor N3 includes a gate that receives signal EN, and a source that is coupled to GND. Transistor P6 includes a source that is coupled to VDD, a gate receives signal ENB, and a drain that is coupled to the source of transistor P7. Transistor P7 includes a gate that is coupled to the drain of transistor P4, and a drain that is coupled to the drain of transistor N4. Transistor N4 includes a gate that is arranged to receive signal BIASN, and a source that is coupled to the drain of transistor N5. Transistor N5 includes a gate that receives signal EN, and a source that is coupled to GND.

Signals EN and ENB are inverted with respect to one another, and arranged to disable the level shifter circuit and the gain circuit when not in use to conserve power. The source of transistor P4 is arranged to provide a level shifted signal (TEMPLS) signal that is related to the input signal (IN) according to a level shifting function. The drain of transistor P7 is arranged to provide an output signal (OUT) signal that is related to the level shifted signal (TEMPLS) according to a gain function.

The amount of DC signal level shifting that is provided by level shifting circuit LS is determined by biasing signal BIASP, and related to the size of transistor P5 and the relative size of transistor P4 relative to transistor P2. In one example, transistor P4 is matched in size relative to transistor P2. In another example, transistor P4 is scaled in size relative to transistor P2. In still another example, additional transistors are selectively coupled in parallel with transistor P4 such that the relative scaling factors are adjustable in response to one or more selection signals (e.g., BIASADJ).

Gain circuit G is illustrated as an inverting gain stage, where transistor P7 is biased to operate as an inverting amplifier by transistor N4, which is biased as a current source. Although gain circuit G is illustrated as an inverting amplifier, other amplifier topologies may be employed including: non-inverting amplifiers, cascade amplifiers, cascode amplifiers, and differential amplifiers. In one example, an additional inverting amplifier circuit is arranged to receive the output signal to provide a new output signal that is non-inverting with respect to the level shifted signal (TEMPLS). In another example, the gain circuit (G) includes a cascode current source in place of transistor N4. In still another example, the gain circuit (G) is replaced with a differential amplifier that has one input coupled to a signal ground.

By applying the above described techniques the effective temperature sensitivity of the sensor system is increased by a factor that is determined by the gain of the amplifiers. The new sensitivity is determined as $G \cdot \phi_S$. During operation the unused amplifiers can be disabled by the various control logic blocks such that overall power dissipation is reduced. The various electronic components described in each of the systems can be arranged to provide absolute temperature sensing since each amplifier output corresponds to a fine resolution, and the selected amplifier is associated with a coarse resolution.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus comprising:
    a temperature sensor block that is arranged to provide a temperature signal (TEMP) that is responsive to changes in an operating temperature (T);
    a level shifter block that is arranged to: receive the temperature signal (TEMP), and provide a level shifted temperature signal (TEMPLS) that is related to the temperature signal (TEMP) by a DC level shift;
    a gain block that is arranged to: receive the level shifted temperature signal (TEMPLS) and provide an output signal (OUT) that is related to the level shifted temperature signal (TEMPLS) according to a gain factor (G);
    an analog-to-digital converter (ADC) block that is arranged to: receive the output signal (OUT), and provide a control signal (CTL2) that is related to an operating temperature; and
    a control logic block that is arranged to: receive the control signal (CTL2) and provide another control signal (CTL1) to at least one of the level shifter block and the gain block such that a dynamic range associated with the temperature sensitivity of the apparatus is extended.

2. The apparatus of claim 1, the temperature sensor block is arranged such that the temperature signal is proportional-to-absolute-temperature (PTAT).

3. The apparatus of claim 1, wherein the temperature sensor block is arranged such that the temperature signal corresponds to at least one of a voltage that is proportional-to-absolute temperature (VPTAT) and a current that is proportional-to-absolute temperature (IPTAT).

4. The apparatus of claim 1, the level shifter block comprising a plurality of level shifter circuits (LS1–LSN), wherein each of the plurality of level shifter circuits is arranged to provide a different DC level shift to temperature signal (TEMP) resulting in a plurality of level shifted temperature signals (TEMPLS1–TEMPLSN).

5. The apparatus of claim 4, the level shifter block further comprising a multiplexer circuit that is arranged to receive the plurality of level shifted signals (TEMPLS1–TEMPLSN) and select one of the plurality of level shifted signals (TEMPLS1–TEMPLSN) as the level shifted temperature signal (TEMPLS) in response to the other control signal (CTL1).

6. The apparatus of claim 1, the level shifter block comprising a level shifter circuit (LS) and an adjustable bias circuit, wherein the adjustable bias circuit is arranged to provide a biasing signal (BIAS) to the level shifter circuit (LS) such that the a DC level shift associated with the level shifted temperature signal (TEMPLS) is responsive to a bias adjustment signal (BIASADJ) that corresponds to the other control signal (CTL1).

7. The apparatus of claim 1, the gain block comprising a plurality of grain circuits (G1–GN), wherein each of the gain circuits is arranged to operate over different signal input ranges such that each of the plurality of gain circuits (G1–GN) is arranged to respond to different temperature ranges associated with the temperature signal (TEMP) resulting in a plurality of output signals (S1–SN).

8. The apparatus of claim 7, the gain block further comprising a multiplexer circuit that is arranged to receive the plurality of output signals (S1–SN) and select one of the plurality of output signals (S1–SN) as the output signal (OUT) in response to the other control signal (CTL1).

9. The apparatus of claim 8, the ADC block comprising a plurality of comparator circuits (CP1–CPN) that are arranged in cooperation with a decoder logic block, wherein each of the plurality of comparators (CP1–CPN) is arranged to receive a respective one of the plurality of output signals (S1–SN), and wherein the decoder logic block is arranged to cooperate with the multiplexer circuit to select an appropriate one of the plurality of output signals (S1–SN) based on a temperature range that is identified by the ADC block.

10. The apparatus of claim 1, wherein the temperature sensor block, the level shifter block, the gain block, the analog-to-digital converter (ADC) block, and the control logic block are provided in an integrated circuit.

11. The apparatus of claim 1, wherein the level shifter block and the gain block are combined in a common circuit.

12. An apparatus comprising:
    a sense means that is arranged to provide a temperature signal (TEMP) that is responsive to changes in an operating temperature (T);
    a level shifting means that is arranged to provide a level shifted temperature signal (TEMPLS) that is related to the temperature signal (TEMP) by a DC level shift;
    a gain means that is arranged to: receive the level shifted temperature signal (TEMPLS) and provide an output signal (OUT) that is related to the level shifted temperature signal (TEMPLS) according to a gain factor (G);
    an analog-to-digital converter (ADC) means that is arranged to: receive the output signal (OUT), and provide a control signal (CTL2) that is related to the operating temperature; and
    a control means that is arranged to: receive the control signal (CTL2) and provide another control signal (CTL1) to at least one of the level shifter block and the gain block such that a temperature sensitivity range associated with the apparatus has an extended dynamic range.

13. A method comprising:
    sensing an operating temperature (T) associated with the apparatus to provide a temperature signal (TEMP);
    adjusting a DC offset to provide a level shifted temperature signal (TEMPLS) that is related to the temperature signal (TEMP) according to a level shift factor;
    scaling a signal level that is associated with the level shifted temperature signal (TEMPLS) to provide an output signal (OUT); that is related to the level shifted temperature signal (TEMPLS) according to a gain scale factor;
    identifying the operating temperature (T) based on the output signal (OUT); and changing at least one of the level shift factor and the gain scale factor in response to the detected range of operating temperatures such that a dynamic range associated with the temperature sensitivity of the apparatus is extended.

14. The method of claim 13, wherein sensing an operating temperature (T) comprises providing the temperature signal (TEMP) with a sensor that is operable over a range of sensor signal levels; and wherein scaling a signal level comprises scaling with an amplifier circuit that is operable over a range of input signal levels that is narrower than the range of sensor signal levels.

15. The method of claim 14, wherein adjusting the DC offset comprises dynamically adjusting the DC offset such that the level shifted temperature signal (TEMPLS) is within the range of input signal levels of the amplifier circuit.

16. The method of claim 13, wherein sensing an operating temperature (T) comprises providing the temperature signal (TEMP) with a sensor that is operable over a range of sensor signal levels; and wherein scaling a signal level comprises: selecting an output from one of a plurality of amplifier circuits, wherein each amplifier circuit is operable over a range of input signal levels that is narrower than the range of sensor signal levels.

17. The method of claim 16, wherein adjusting the DC offset comprises dynamically adjusting the DC offset such that the level shifted temperature signal (TEMPLS) is within the range of input signal levels of at least one of the plurality of amplifier circuits.

18. The method of claim 13, wherein sensing an operating temperature (T) comprises providing the temperature signal (TEMP) with a sensor that is operable over a range of sensor signal levels; wherein adjusting the DC offset comprises coupling the temperature signal (TEMP) to a plurality of level shifter circuits, and selecting an output from one of the plurality of level shifter circuits; and wherein scaling a signal level comprises scaling with an amplifier circuit that is operable over a range of input signal levels that is narrower than the range of sensor signal levels, wherein the selected level shifter circuit is arranged to adjust the DC offset such that the level shifted temperature signal (TEMPLS) is within the range of input signal levels of the amplifier circuit.

19. The method of claim 13, wherein sensing an operating temperature (T) comprises providing the temperature signal (TEMP) with a sensor that is operable over a range of sensor signal levels; wherein adjusting the DC offset comprises coupling the temperature signal (TEMP) to a plurality of level shifter circuits; and wherein scaling a signal level comprises: coupling the outputs of the plurality of level shifter circuits to a plurality of amplifier circuits, wherein each amplifier circuit is operable over a range of input signal levels that is narrower than the range of sensor signal levels, wherein the plurality of level shifter circuits are arranged to adjust the DC offset such that the level shifted temperature signal (TEMPLS) such that each of the plurality of amplifier circuits is operable over a different range of temperatures associated with the temperature signal (TEMP).

20. The method of claim 19, wherein changing at least one of the level shift factor and the gain scale factor corresponds to selecting an output from one of the plurality of amplifier circuits.

* * * * *